INVENTOR.
BERNHARD BIRKENES, DECEASED
BY RANDI BIRKENES, ADMINISTRATRIX
BY
Mueller & Aichele
ATTYS.

United States Patent Office 3,165,700
Patented Jan. 12, 1965

3,165,700

MIXER CIRCUIT FOR AUTODYNE RECEIVER IN WHICH UNTUNED COIL COUPLES SIGNAL TO INTERMEDIATE FREQUENCY TRANSFORMER

Bernhard Birkenes, deceased, late of Chicago, by Randi Birkenes, administratrix, Chicago, Ill., assignor to Motorola Inc., Chicago, Ill., a corporation of Illinois Filed Oct. 19, 1962, Ser. No. 231,870
7 Claims. (Cl. 325—440)

Figure 1:
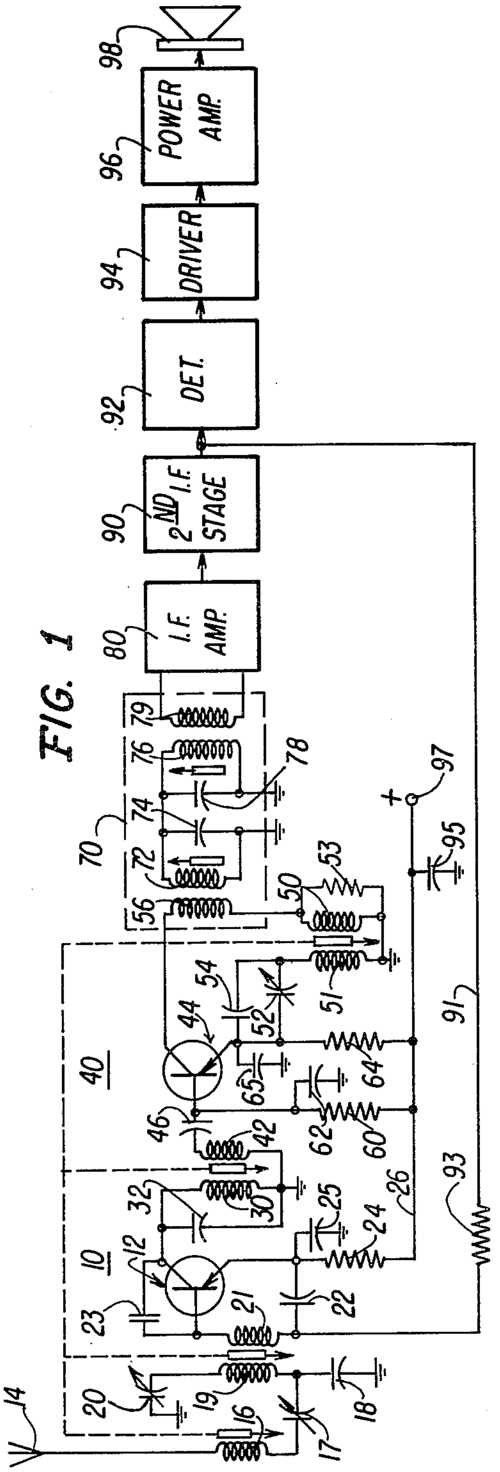

This invention relates to a radio receiver and more particularly to a transistorized receiver having an improved transistor converter.

Present day commercial broadcast receivers often employ a single transistor to function both as a local oscillator and as a mixer to provide heterodyning operation. The autodyne converter is one such circuit, wherein the incoming radio-frequency signal is applied between the base and emitter of a transistor and the intermediate frequency signal is obtained at the collector electrode. Oscillator operation is obtained by feedback, through a tuned circuit, from the collector to the emitter electrodes. In many practical applications this feedback circuit includes the coil of the tuned circuit portion of the oscillator connected in series with the tuned primary of an I.F. transformer connected to the collector electrode of the converter transistor.

While a single transistor converter of this type is advantageous from the standpoint of economics and circuit simplicity, it has disadvantages that are objectionable in quality receivers. The collector impedance of the converter transistor tends to change with incoming signal strength, which results in a frequency shift and loss of selectivity of the tuned input coupling for the first I.F. stage. In addition, the impedance presented by the oscillator circuit, in series with the tuned input of the intermediate frequency transformer, lowers its effective Q and results in an appreciable reduction in selectivity of the I.F. stage. In applications for which transistorized receivers are well adapted, such as portable radio receivers and auto radio sets, the detuning and loss of selectivity in the I.F. stages caused by impedance changes of the converter transistor can present a vexing problem in that the operational environment of the receiver, and hence the incoming signal strength, may constantly undergo a change.

It is therefore an object of this invention to provide a transistor converter circuit in which adverse effects caused by changes in incoming signal strength are minimized.

Another object is to provide means for coupling the output of a converter in a transistorized broadcast receiver to a tuned intermediate frequency transformer without reducing the selectivity of such a transformer.

A further object is to provide a broadcast receiver utilizing a single transistor converter wherein maximum Q of the tuned input of the subsequent I.F. stage can be realized.

A feature of this invention is the provision of a transistor converter wherein the intermediate frequency output signal is inductively coupled by an untuned coil winding to a tuned primary of an I.F. transformer so that impedance changes in the converter have little or no effect on the selectivity of the tuned primary.

Another feature of this invention is the provision of an untuned, low impedance winding connected in series between the output collector electrode of a converter transistor and the oscillator coil associated therewith for coupling to the tuned primary of an intermediate transformer so as not to reduce the selectivity of the I.F. stage.

Still another feature of the present invention is the provision of an inductive winding means for coupling the output signal of a transistor converter to the tuned primary of an intermediate frequency transformer so that one side of the tuned input of the transformer may be connected directly to a reference point. This circuit arrangement eliminates the necessity of providing a feedback impedance in series with the transformer primary enabling higher selectivity to be achieved.

In a particular form of the invention, as embodied in a transistorized broadcast receiver, the incoming radio frequency signal is amplified and fed to the base electrode of a transistor functioning as a converter. Local oscillations generated by regenerative feedback between collector and emitter electrodes of the transistor have a frequency which is determined by a tuned circuit in this feedback path. Mixing between the incoming radio frequency signal and the local oscillations is accomplished by the converter transistor, and an intermediate frequency signal is produced at the output collector electrode. A low impedance, untuned inductive winding is series connected between the collector electrode of the converter transistor and the oscillator coil to complete the feedback path and to provide indirect coupling to the tuned primary of an intermediate frequency transformer for the intermediate frequency signals produced by the mixing action. Because of this indirect coupling, the tuned primary of the intermediate frequency transformer is not detuned or reduced in selectivity by impedance changes in the collector circuit portion of the converter transistor, as is normally experienced in an autodyne converter having the tuned primary of the intermediate frequency transformer directly connected in series between the collector electrode and the coil element of the oscillator portion of the circuit. In addition, since the tuned primary of the intermediate frequency transformer is not directly connected to the coil of the oscillator circuit portion, it is possible to return one side of the tuned primary directly to reference point. This results in a higher Q input to the intermediate frequency transformer, and consequently a more selective I.F. stage.

Referring now to the drawings, FIG. 1 shows partly in schematic and partly in block diagram form a transistorized receiver employing the converter circuit of the present invention. Typically, such a receiver may be adapted to operate directly from a nominal 14 volt generator or alternator and battery electrical system of an automobile. Radio frequency amplifier stage 10 includes transistor 12. The incoming signal is selected by a double tuned network connected between antenna 14 and the base of transistor 12. This network includes slug tuned inductor 16 tuned to resonance with capacitors 17 and 18, and slug tuned inductor 19 tuned to resonance with capacitors 18 and 20. Inductive winding 21, closely coupled to inductor 19, applies the selected radio frequency signal, through capacitor 22, between the base and emitter electrodes of transistor 12.

Amplifier stage 10 also includes a neutralizing capacitor 23 connected between collector and base of transistor 12, and emitter stabilizing resistor 24, suitably bypassed by capacitor 25, connected between the emitter and direct current potential supply lead 26. The radio frequency output signal appearing at the collector electrode of transistor 12 is fed to slug tuned inductor 30, tuned to resonate at the selected signal frequency with capacitor 32. Winding 42, closely coupled to winding 30, feeds the radio frequency signal, through coupling capacitor 46, to the base electrode of transistor 44 of converter stage 40.

Transistor 44 functions both as a mixer and a local oscillator to provide an intermediate frequency output. Tuned inductors 50 and 51, tracking capacitor 52, and capacitor 54 form a resonant circuit tunable to local oscillator frequency. One side of the parallel combination of capacitors 52, 54 is connected to the emitter electrode of transistor 44, while the other side is connected by winding 51 to ground. Winding 50, inductively coupled to winding 51, is series connected between one end of winding 56 and ground. The other side of winding 56 is connected to the collector electrode of transistor 44 to complete an emitter to collector feedback path. Resistor 53 shunts winding 50. Base bias for transistor 44 is developed through resistor 60, connected between the base electrode and potential supply lead 26, and suitably bypassed by capacitor 62 to establish a radio frequency reference point. Resistor 64, connected between the emitter of transistor 44 and potential supply lead 26, provides emitter bias. Capacitor 65 couples the emitter electrode of transistor 44 to ground reference potential.

The regenerative collector to emitter feedback path, including the tuned circuit of inductors 50 and 51 and capacitors 52 and 54, sustained local oscillations which, when mixed with the incoming radio-frequency signal supplied to the base of transistor 44, produces an intermediate frequency output. The intermediate frequency signal is coupled by low impedance, untuned winding 56 to primary winding 72 of transformer 70. Primary winding 72 is shunted by tuning capacitor 74, and one side of this combination is returned to a reference point. Secondary winding 76, inductively coupled to primary winding 72, is shunted by tuning capacitor 78, with one side of this combination also returned to a reference point. An additional untuned winding 79 couples the intermediate frequency signal to intermediate frequency amplifier stage 80. The remainder of the receiver circuit is of conventional design, and may conveniently include a second intermediate frequency stage 90, detector 92, driver stage 94 and power amplifier 96 to energize speaker 98. Direct current may be applied to potential supply lead 26 from an automobile electrical system or suitable battery supply at terminal 97. Filtering is provided by capacitor 95. If the receiver is to be employed in an automobile, additional filtering and noise suppression circuits may be used. Automatic gain control is fed to radio frequency stage 10 via lead 91 and resistor 93. The AGC signal may be obtained from any subsequent stage as is conventional in the art, and for convenience is shown to be supplied from the output of the second intermediate frequency amplifier stage. It is to be further understood that AGC may also be supplied to control electrodes of the IF stages in the well known manner.

The autodyne type converter, indirectly coupled to the intermediate frequency transformer in the manner described provides a receiver of improved sensitivity and selectivity. In a converter of this type the collector impedance of the transistor tends to change with incoming signal strength. By making the inductance of the coupling winding a low impedance at intermediate frequency and providing loose coupling to the transformer primary, the effect of the converter transistor impedance change as coupled to the tuned primary of the IF transformer is minimized. In addition, by indirectly coupling to the primary of the IF transformer, and by using an untuned winding to complete the feedback circuit for the converter, the oscillator resonant circuit, tuned to a different frequency than the IF transformer, is not connected in series with the IF transformer primary. Such a direct series connection of the oscillator tuned circuit presents an impedance which tends to lower the Q of the intermediate frequency stage, and hence reduces receiver selectivity.

As can be seen from FIG. 1, intermediate frequency transformer 70 includes a single shielded enclosure assembly having tuned primary winding 72 and tuned secondary winding 76. Untuned winding 56, of low impedance and adapted to be connected in series in the collector to emitter feedback path of the converter transistor, inductively couples the intermediate frequency signal to primary winding 72, while untuned winding 79, inductively coupled to the secondary winding, provides a signal to the input of the intermediate frequency amplifier.

Figure 2:
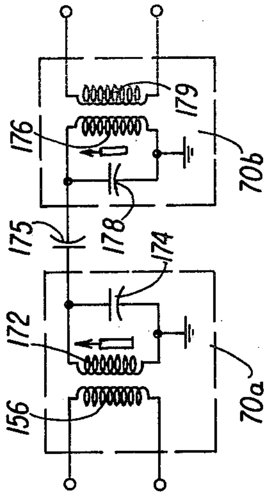

An alternate embodiment of this converter coupling arrangement is shown in FIG. 2. Low impedance untuned winding 156 forms an inductive coupling to winding 172 of transformer section 70*a*. Tuning capacitor 174 shunts winding 172 and the combination is connected to ground. Capacitor 175 couples transformer section 70*a* to transformer section 70*b*. Winding 176, shunted by capacitor 178, has one side connected to ground. Untuned, low impedance winding 179, coupled to winding 176, provides an impedance match to the base input electrode of the intermediate frequency transistor amplifier.

Coupling between the converter and the primary of the intermediate frequency transformer in either of the above disclosed embodiments is readily accomplished by a flat winding of 10 to 20 turns disposed around a form which may conveniently be slipped over the primary coil of the IF transformer. Conventional IF transformers used in transistorized receivers may be employed without modification other than that mentioned. As shown, the invention may be used with IF transformers having tuned primary and secondary windings inductively coupled in a single shielded enclosure, or may be employed using separate shielded tuned circuits, capacitively coupled, one functioning as a primary winding and the other functioning as a secondary winding. A similar winding over the secondary of the IF transformer provides an untuned coupling for proper impedance match to the input electrode of the intermediate frequency transistor amplifier.

The invention provides, therefore, a simple and improved converter circuit for use with transistorized radio receivers. A low impedance, untuned output coupling from the converter prevents detuning and loss of selectivity of the intermediate frequency stages, caused by changes in impedance in the converter as a result of changes in input signal strength. At the same time, this arrangement allows for indirect coupling to the tuned IF input so that maximum Q may be realized in the IF stages. Thus, it is possible to obtain improved performance from a receiver using a single transistor converter.

What is claimed is:

1. In a wave signal receiver having a stage for translating the frequency of a received signal to an intermediate frequency signal and a stage for selectively passing said intermediate frequency signal, the combination including a transistor having emitter, base, and collector electrodes; means coupling said received signal to said base electrode; a circuit path connecting said collector electrode to said emitter electrode, said path including an untuned inductance means series connected with a resonant circuit tuned to a predetermined frequency, with said path providing regenerative feedback to produce oscillations at said predetermined frequency other than the frequency of said received signal so that said oscillations are mixed with said received signal in said transistor to produce said intermediate signal; and circuit means including a resonant circuit tuned to said intermediate frequency inductively coupled to said untuned inductance means to pass said intermediate frequency signal.

2. A converter circuit including in combination, transistor means having base, emitter, and collector electrodes, means to couple a received radio frequency signal to said base electrode, an untuned inductive winding having one end thereof connected to said collector electrode, a capacitor network including a fixed capacitor connected in parallel with a variable capacitor, with one end of said capacitor network connected to said emitter electrode, and a tunable inductance network having a first winding connected between the other end of said untuned winding and a reference potential and a second winding connected between the other end of said capacitor network and a reference potential, said inductance network tunable to resonance with said capacitor network at a predetermined frequency other than the frequency of said received signals so that feedback between said collector and emitter electrodes sustain oscillations at said predetermined frequency, whereby said oscillations are mixed in said transistor with said received signals to produce signals having sum and difference frequencies appearing across said untuned winding.

3. A converter circuit including in combination, transistor means having base, emitter, and collector electrodes, means to couple a received radio frequency signal to said base electrode, tuned circuit means including variable inductor means and variable capacitor means, said tuned circuit means tunable to resonate at frequencies other than frequencies of said received signal, means connecting one side of said tuned circuit means to said emitter electrode, and untuned impedance means series connected between said collector electrode and the other side of said tuned circuit means to complete a feedback path between said collector electrode and said emitter electrode so that oscillations are sustained at a frequency determined by said tuned circuit means, whereby said oscillations are mixed with said received signals in said transistor to produce sum and difference frequencies appearing across said untuned impedance means.

4. The converter circuit of claim 3 wherein said untuned impedance means includes an inductive winding inductively coupled to the primary of a transformer tuned to one of said sum and difference frequencies.

5. In a superheterodyne receiver having means to receive a radio frequency signal, means to convert said received signal to an intermediate frequency signal, and means to pass said intermediate frequency signal, the combination including a transistor having base, emitter, and collector electrodes, means to couple said radio frequency signal to said base electrode, resonant circuit means tunable to a local oscillator frequency signal, means connecting one side of said resonant circuit means to said emitter electrode, transformer means having a primary winding tuned to said intermediate frequency signal, an inductive winding coupled to said primary winding, said inductive winding series connected between said collector electrode and the other side of said resonant circuit means to complete a feedback path between said emitter electrode and said collector electrode to sustain local oscillations in said resonant circuit means, whereby said local oscillation signals are mixed with said radio frequency signals in said transistor to provide an intermediate frequency signal across said inductive winding.

6. In a radio receiver having a converter to translate a received signal of a first frequency to a signal of a second frequency, the combination including a transistor having base, emitter and collector electrodes, means to couple said first frequency signal to said base electrode, resonant circuit means tunable to a third frequency, means to connect one side of said resonant circuit means to said emitter electrode, transformer means having primary and secondary windings tuned to said second frequency signals, an untuned winding series connected between said collector electrode and the other side of said resonant circuit means, said winding and said resonant circuit means providing a feedback path between said collector and emitter electrodes to sustain oscillations of said third frequency in said resonant circuit means, said third frequency signals being mixed with said first frequency signals in said transistor to produce said second frequency signals across said untuned winding to be coupled to said primary winding, and means for coupling said secondary winding to signal amplification means.

7. In a radio receiver having a converter to translate a received signal of a first frequency to a signal of a second frequency, the combination including a transistor having base, emitter, and collector electrodes, means to couple said first frequency signal to said base electrode, resonant circuit means tunable to a third frequency, means to connect one side of said resonant circuit means to said emitter electrode, first tuned circuit tuned to said second frequency signal, second tuned circuit tuned to said second frequency signal, capacitor means connected between said first and second tuned circuits, first inductive winding coupled to said first tuned circuit, said first inductive winding series connected between said collector electrode and the other side of said resonant circuit means to complete a feedback path between said collector and emitter electrodes to sustain oscillations of said third frequency in said resonant circuit means, said third frequency signals being mixed with said first frequency signals in said transistor to produce said second frequency signals across said first inductive winding, and second inductive winding coupled to said second tuned circuit to provide output signals of said second frequency.

No references cited.